United States Patent
Shiraiwa et al.

(10) Patent No.: US 6,740,605 B1
(45) Date of Patent: May 25, 2004

(54) PROCESS FOR REDUCING HYDROGEN CONTAMINATION IN DIELECTRIC MATERIALS IN MEMORY DEVICES

(75) Inventors: Hidehiko Shiraiwa, San Jose, CA (US); Jaeyong Park, Sunnyvale, CA (US); Fred T K Cheung, San Jose, CA (US); Arvind Halliyal, Cupertino, CA (US)

(73) Assignees: Advanced Micro Devices, Inc., Sunnyvale, CA (US); Fujitsu Limited, Kawasaki (JP)

(*) Notice: Subject to any disclaimer, the term of this patent is extended or adjusted under 35 U.S.C. 154(b) by 0 days.

(21) Appl. No.: 10/429,447

(22) Filed: May 5, 2003

(51) Int. Cl.$^7$ .................... H01L 21/26; H01L 21/324
(52) U.S. Cl. .................. 438/795; 438/798; 438/791; 438/471; 438/473; 438/474
(58) Field of Search ............................. 438/778, 780, 438/781, 795, 798, 787, 791, 769, 770, 775, 799, 471, 473, 474

(56) References Cited

U.S. PATENT DOCUMENTS

| | | | | |
|---|---|---|---|---|
| 5,840,600 A | * | 11/1998 | Yamazaki et al. | 438/151 |
| 5,872,387 A | * | 2/1999 | Lyding et al. | 257/607 |
| 5,970,384 A | * | 10/1999 | Yamazaki et al. | 438/795 |
| 6,306,777 B1 | * | 10/2001 | Ogle, Jr. et al. | 438/763 |
| 6,319,775 B1 | * | 11/2001 | Halliyal et al. | 438/261 |
| 6,319,809 B1 | * | 11/2001 | Chang et al. | 438/597 |
| 6,468,599 B1 | * | 10/2002 | Terada | 427/558 |

OTHER PUBLICATIONS

U.S. patent application Ser. No. 10/359,872, filed Feb. 7, 2003, entitled "Method of Formation of Semiconductor Resistant to Hot Carrier Injection Stress."

* cited by examiner

Primary Examiner—Maria Guerrero
(74) Attorney, Agent, or Firm—Renner, Otto, Boisselle & Sklar, LLP

(57) ABSTRACT

The present invention, in one embodiment, relates to a process for fabricating a semiconductor device that is less susceptible to performance degradation caused by hydrogen contamination. The method includes the steps for removing unwanted hydrogen bonds by exposing the hydrogen bonds to ultraviolet radiation sufficient to break the bond and annealing in an atmosphere comprising at least one gas having at least one atom capable of forming bonds that replace the hydrogen bonds.

20 Claims, 5 Drawing Sheets

PROCESS FOR REDUCING HYDROGEN CONTAMINATION IN DIELECTRIC MATERIALS IN MEMORY DEVICES

TECHNICAL FIELD

The present invention relates to semiconductor devices and the fabrication thereof and, more particularly, to a process for reducing hydrogen contamination in dielectric materials in memory devices.

BACKGROUND ART

Non-volatile memory devices are currently in widespread use in electronic components that require the retention of information when electrical power is terminated. Non-volatile memory devices include read-only-memory (ROM), programmable-read-only memory (PROM), erasable-programmable-read-only memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, flash EEPROM devices enable the erasing of all memory cells in the device using a single electrical current pulse.

Product development efforts in memory device technology have focused on increasing the programming speed, lowering programming and reading voltages, increasing data retention time, reducing cell erasure times and reducing cell dimensions. Many memory devices utilize a charge trapping dielectric material, such as an oxide-nitride-oxide (ONO) structure. For example, one memory device that utilizes the ONO structure is a silicon-oxide-nitride-oxide-silicon (SONOS) type cell. Another memory device that utilizes the ONO structure is a floating gate FLASH memory device, in which the ONO structure is formed over the floating gate, typically a polysilicon floating gate.

During the programming of charge trapping dielectric charge storage devices, electrical charge is transferred from a substrate to the charge trapping dielectric charge storage layer in the device, e.g., the nitride layer in a SONOS device. Voltages are applied to the gate and drain creating vertical and lateral electric fields, which accelerate the electrons along the length of the channel. As the electrons move along the channel, some of them gain sufficient energy to become trapped in the charge trapping dielectric material. This jump is known as hot carrier injection (HCI), the hot carriers being electrons. Charges are trapped near the drain region because the electric fields are the strongest near the drain. Reversing the potentials applied to the source and drain will cause electrons to travel along the channel in the opposite direction and be injected into the charge trapping dielectric layer near the source region. Because parts of the charge trapping dielectric layer are not electrically conductive, the charges introduced into these parts of the charge trapping dielectric material tend to remain localized. Accordingly, depending upon the application of voltage potentials, electrical charge can be stored in discrete regions within a single continuous charge trapping dielectric layer.

Non-volatile memory designers have taken advantage of the localized nature of electron storage within a charge trapping dielectric layer and have designed memory circuits that utilize two or more regions of stored charge within the charge storage layer. This type of non-volatile memory device is known as a dual-bit, two-bit or multi-bit memory cell. In dual-bit memory cells, a left bit and a right bit are stored in physically different areas of the silicon nitride layer, in left and right regions of each memory cell, respectively. The above-described programming methods are used to enable the two bits to be programmed and read simultaneously. Each of the two bits of the memory cell can be individually erased by applying suitable erase voltages to the gate and to either the source or drain regions. In addition, multi-bit memory cells recently have been developed, in which more than two bits can be stored in separate regions of a single charge storage layer of the memory cell. As used herein, the term "multi-bit" refers to both dual-bit and higher-bit memory cells, unless otherwise specifically stated.

Various aspects of the memory cell, such as the charge storage layer, spacers, and etch stop layers (ESL), have conventionally been made from a material such as silicon nitride. Such silicon nitride aspects have conventionally been deposited by plasma enhanced chemical vapor deposition (PECVD). The charge storage layer and spacers are usually deposited by LPCVD and ESL is usually by PECVD. PECVD tends to contain more hydrogen but even LPCVD contains some hydrogen and causes problems. For example, the conventionally employed PECVD method can impart from about 10 to about 30 atomic percent hydrogen into the deposited silicon nitride, whether the nitride is a charge storage layer, a spacer, or an ESL. Thus, there is a need to reduce hydrogen content in either instance.

As device dimensions continue to be scaled down, the hydrogen content of nitrides can present a problem to devices such as charge trapping dielectric memory devices. Although not to be bound by theory, it is hypothesized that excess hydrogen conventionally found in the nitrides can migrate into the dielectric layers separating the charge storage layer from the substrate and the control gate electrode. Specifically, excess hydrogen is thought to migrate into the bottom dielectric layer, or into the top dielectric layer. The presence of this additional hydrogen in the bottom dielectric layer and/or top dielectric layer is thought to result in changes in the barrier height of these layers, and thus to affect performance of the charge storage dielectric memory device.

While Si—H bonds are of particular concern, any hydrogen bonds, such as N—H bonds in memory cell nitrides can theoretically affect the performance of charge storage dielectric memory devices. Thus, the hydrogen content of memory cell nitrides presents a problem to proper functioning of the ever-smaller devices.

Accordingly, advances in the fabrication and treatment of memory cell nitrides to eliminate hydrogen are needed. Thus, the present invention provides a process for removing hydrogen from memory cell nitrides.

DISCLOSURE OF THE INVENTION

According to the present invention, there is provided a process for removing hydrogen contamination from a semiconductor device. In one embodiment, the method includes steps of forming at least one dielectric layer, wherein the dielectric layer comprises dielectric-hydrogen bonds; irradiating the dielectric layer with ultraviolet radiation sufficient to break at least a portion of the dielectric-hydrogen bonds; and annealing the dielectric layer in an atmosphere comprising at least one gas having at least one atom capable of forming dielectric-atom bonds, whereby at least a portion of dielectric-hydrogen bonds are replaced with dielectric-atom bonds.

Also according to the present invention, there is provided a process for fabricating a semiconductor device. In one embodiment, the method includes providing a semiconductor substrate; forming an ONO material over the semiconductor substrate; forming a gate electrode layer over the ONO material; forming a dielectric spacer adjacent to the stacked gate and a dielectric etch stop layer over the stacked gate and protective spacer such that at least one of the dielectric spacer and dielectric etch stop layer comprises dielectric-hydrogen bonds; irradiating at least one of the dielectric spacer and the dielectric etch stop layer with ultraviolet radiation sufficient to break at least a portion of the dielectric-hydrogen bonds; and annealing at least one of the spacer and the etch stop layer in an atmosphere comprising at least one gas having at least one atom capable of forming dielectric-atom bonds, whereby at least a portion of dielectric-hydrogen bonds are replaced with dielectric-atom bonds.

In further accordance with the present invention, there is provided a process for fabricating a semiconductor device. The process includes providing a semiconductor substrate; forming an oxide layer over the semiconductor substrate; forming a nitride layer over the oxide layer, the oxide layer and the nitride layer forming an interface comprising silicon-hydrogen and nitrogen-hydrogen bonds; irradiating the interface with ultraviolet radiation sufficient to break at least a portion of at least one of the silicon-hydrogen and nitrogen-hydrogen bonds; and annealing the interface in an atmosphere comprising at least one gas having at least one atom capable of forming at least one of silicon-atom bonds and nitrogen-atom bonds, whereby at least a portion of at least one of the silicon-hydrogen bonds and nitrogen-hydrogen bonds are replaced with at least one of the silicon-atom bonds and nitrogen-atom bonds. (In another embodiment, after UV irradiation, the annealing may be carried out in vacuum or inert gas only. In this case, broken dielectric-hydrogen bonds are not replaced by dielectric-atom bonds but some of hydrogen can diffuse out of the film. Of course some of hydrogen can reform dielectric-hydrogen bonds but the total hydrogen amount can be less than the original.

Figure 1:
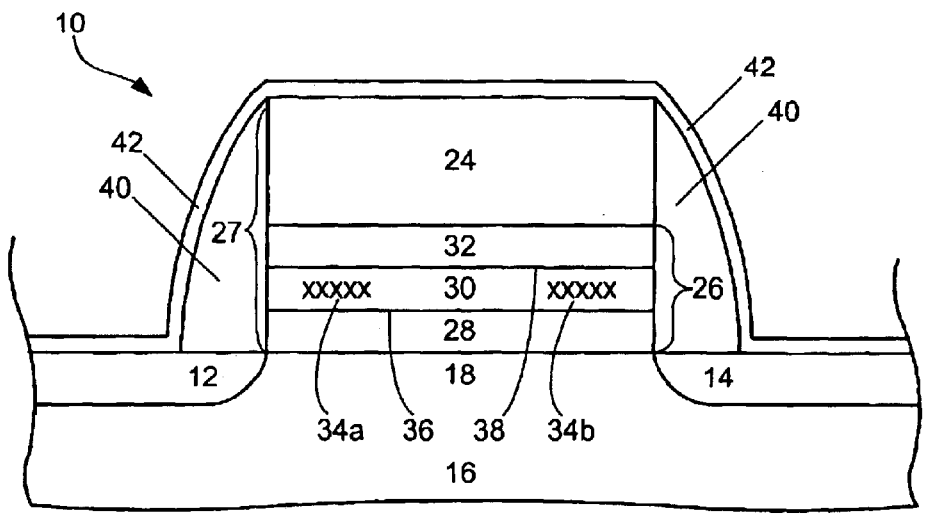
FIG. 1 illustrates a portion of a semiconductor substrate containing a multi-bit memory cell fabricated in accordance with the invention.

It should be appreciated that for simplicity and clarity of illustration, elements shown in the Figures have not necessarily been drawn to scale. For example, the dimensions of some of the elements are exaggerated relative to each other for clarity. Further, where considered appropriate, reference numerals have been repeated among the Figures to indicate corresponding elements.

DETAILED DESCRIPTION OF THE INVENTION

It should be appreciated that the process steps and structures described below do not, form a complete process flow for manufacturing integrated circuits. The present invention can be practiced in conjunction with integrated circuit fabrication techniques currently used in the art, and only so much of the commonly practiced process steps are included as are necessary for an understanding of the present invention.

Furthermore, it should be appreciated that while the present invention will be described in terms of a two-bit EEPROM device, the present invention is not limited to such device, and is applicable to a broad range of semiconductor devices and their fabrications processes. Generally speaking the semiconductor devices will include at least one active component therein, for example a diode, transistor, thyristor or the like. Illustrative examples include MOS-based devices such as MOSFET devices, including CMOS and NMOS technology, light-emitting diodes, laser diodes, and the like. In this regard, the MOS-based technology discussed herein is intended to encompass the use of gate conductors other than metals as is commonly practiced, and thus reference to MOS-based devices encompasses other insulated gate technologies (e.g. IGFETs). While aspects of the present invention will now be described in more detail with reference to a two-bit EEPROM device, it will be understood that the invention is applicable to the above-mentioned and other semiconductor devices in which hydrogen contamination arises during fabrication.

Turning now to FIG. 1, there is schematically shown in cross-section a memory cell suitable for use in a two-bit EEPROM device. The memory cell 10 includes source/drain regions 12 and 14 located in a semiconductor substrate 16 and separated by a channel region 18. A gate electrode 24 layer overlies the channel region 18 and is separated therefrom by a charge storage structure 26. Because the charge storage structure 26 has been conventionally formed as an oxide, nitride, oxide stack, the charge storage structure 26 is also referred to herein as "ONO" material or layer 26. The term ONO is not meant to limit the scope of the invention, and it should be understood that the term ONO is used to refer to charge storage structures that use materials other than oxides and nitrides. The gate electrode layer 24 and the ONO 26 form a stacked gate structure 27, also referred to herein as gate stack 27. The ONO 26 includes a bottom dielectric layer 28, a charge storage layer 30 and a top dielectric layer 32. A nitride-oxide interface 36 is formed between the charge storage layer 30 and the bottom dielectric layer 28. In addition, a nitride-oxide interface 38 is formed between the charge storage layer 30 and the top dielectric layer 38. Charges 34a and 34b can be stored in the charge storage layer 30.

The following description of the process of the present invention is described in the context of charge storage structure suitable for use in a two-bit EEPROM device, such as the MIRRORBIT™ device. It is to be understood that, while the present invention is discussed herein in that context, that this is merely exemplary and is not intended to limit the scope of the present invention. The charge storage structure fabricated by the presently disclosed method is applicable to any suitable semiconductor device, such as a floating gate FLASH device in which an ONO structure forms an interpoly dielectric, rather than a charge storage structure. In addition, the present invention is applicable more generally to any semiconductor memory device having a dielectric material contaminated by hydrogen In the operation of the exemplary two-bit memory cell 10, voltages are applied to the gate electrode 24 and as appropriate to the source/drain regions 12 and 14. The applied voltages cause electrical charge from the source/drain regions 12 and 14 to propagate across the channel region 18. During programming, once the charge encounters a sufficiently strong vertical field, the charge either is injected or tunnels from the channel region 18 through the bottom dielectric layer 28 into the charge storage layer 30. Such charge tunneling may be referred to as hot carrier injection (HCI). The charge storage layer 30 may also be referred to as an electron storage layer or a charge storage layer. For example, depending upon the particular voltage levels applied to the control-gate electrode 24 and to the source/drain regions 12 and 14, the electrical charges 34a, 34b are injected from the channel region 18 across through the bottom dielectric layer 28 and into the charge storage layer 30. The charges 34a, 34b are localized to regions in proximity to either the source/drain region 12, or the source/drain region 14, as shown in FIG. 1.

Referring still to FIG. 1, isolation spacers 40 are formed on both sides of the gate stack 27. The spacers 40 may be formed of any suitable dielectric material known in the art for such use, such as silicon nitride. In one embodiment, not shown in FIG. 1, a thin layer of silicon dioxide, or other suitable material, is located between the spacers 40 and the gate stack 27. In one embodiment, the thin layer of silicon dioxide or other material is formed or deposited over the surface of the entire gate stack 27 and semiconductor substrate, prior to formation of the layers from which the spacers 40 are formed. The spacers 40 may be formed by any suitable process known in the art.

In addition, the device 10 further includes an etch stop layer (ESL) 42. In one embodiment, the ESL 32 is deposited over both the gate stack 27 and over the surface of the remainder of the semiconductor device 10. In other words, where the gate stack 27 is formed on a first portion of the surface of the semiconductor substrate 16, a second portion of the surface of the semiconductor substrate 16 is not covered by the gate stack 27. Thus, in one embodiment, the ESL 32 is deposited over the gate stack 27 and over a portion of the semiconductor substrate 16 other than where the gate stack 27 is located. The ESL 32 may be deposited by conventional methods, using conventional precursor materials.

Those skilled in the art will recognize that for proper functioning of a two-bit EEPROM device, the electrical charges 34a, 34b preferably remain isolated in the regions of the charge trapping layer 30 to which it is initially introduced. It will also be appreciated by those skilled in the art that silicon-hydrogen bonds and nitrogen-hydrogen bonds can result from or be introduced during the process of forming the charge storage layer 30, spacers 40 and ESL 42. Furthermore, it is theorized that excess hydrogen conventionally found at interface 36, interface 38, charge storage layer 30, spacer 40, or ESL 42 can migrate into the dielectric layers separating the charge storage layer from the substrate and the control gate electrode. Specifically, excess hydrogen is thought to migrate into the bottom dielectric layer, or into the top dielectric layer. The presence of this additional hydrogen in the bottom dielectric layer and/or top dielectric layer is thought to negatively affect performance of the charge storage dielectric memory device. For example, when a bond between a hydrogen atom and an atom of the dielectric material, such as silicon or nitrogen, is broken, a dangling Si bond or other electron- or hole-trapping site is created. Such sites interfere with the proper functioning of the various dielectric materials. Therefore, in accordance with the present invention, the hydrogen bonds associated with the excess hydrogen are broken and replaced with stronger bonds.

Figure 2:
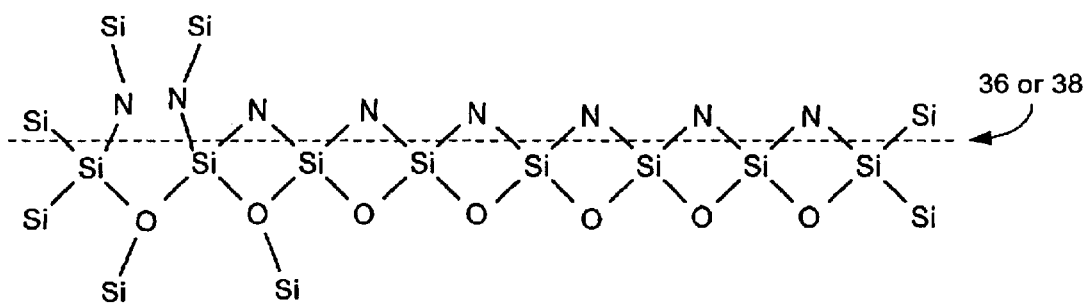
FIGS. 2–4 are schematic diagrams of an interface between a charge storage layer and either an overlying or underlying dielectric layer, in accordance with the present invention.
Figure 3:
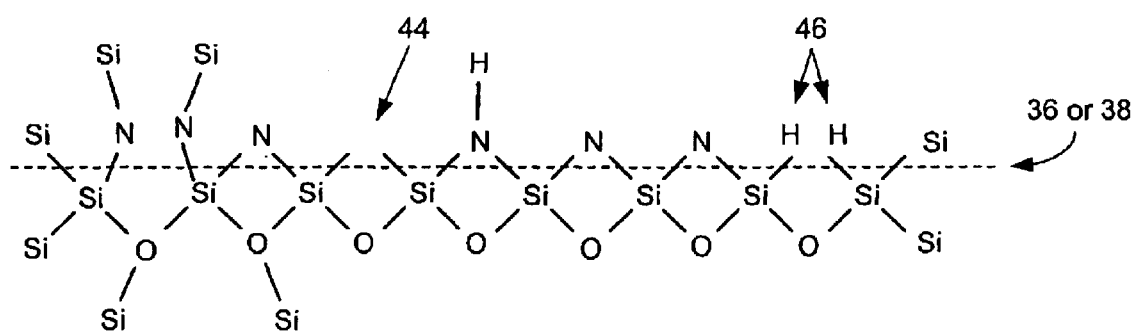
Figure 4:
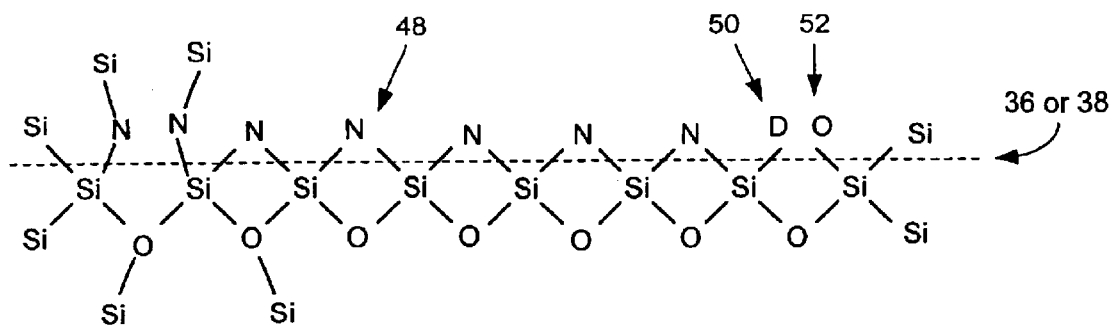

FIGS. 2–4 are schematic diagrams FIGS. 2–4 are schematic diagrams of an interface 36 or 38 between a charge storage layer 30 and either an overlying or underlying dielectric layer, in accordance with the present invention. The interface 36 or 38 depicted illustrates a nitride charge storage layer 30 and an oxide dielectric layer 28 or 32. The invention is not limited to these materials and FIGS. 2–4 are representative of but one embodiment. Those of skill in the art will recognize that the depiction of the interface 36 or 38 shown in FIGS. 2–4 is highly schematic and is presented here for exemplary purposes only, and not for any limited purpose.

FIG. 2 is a schematic diagram of an "ideal" interface 36 or 38, in which there are no silicon-hydrogen bonds or nitrogen-hydrogen bonds, and no dangling silicon or dangling nitrogen bonds. Such an ideal interface is rarely achieved in practice due, for example, to the many variables involved in formation of such an interface. As shown, FIG. 2 depicts a charge storage layer 30 of silicon nitride and a dielectric layer 28 or 32 of silicon dioxide. It is noted that, in accordance with the highly schematic and exemplary nature of these diagrams, rather than the Si—N—Si bonds shown in which both Si atoms are in the charge storage layer 30, it may be more common in an actual substrate-oxide interface that the Si—N—Si bonds at the interface 36 or 38 may comprise one Si atom from the charge storage layer 30 and one Si atom from the dielectric layer 28 or 32.

FIG. 3 is a schematic diagram of an interface 36 or 38 which includes both silicon-hydrogen bonds 46 and dangling silicon bonds 44. Such silicon-hydrogen bonds are easily cleaved to form dangling silicon bonds 44. In interface 36, for example, dangling silicon bonds can act to trap electrons being injected or transferred from the channel region 18 past the interface 36, through the bottom dielectric layer 28 and into the charge storage layer 30.

FIG. 4 is a schematic diagram of the interface 36 or 38 after the method of the present invention has been carried out on the interface 36 or 38 shown in FIG. 3. As shown in FIG. 4, one of the silicon-hydrogen bonds 46 has been replaced by a silicon-deuterium bond 50, and the other of the silicon-hydrogen bonds 46 has been replaced by a silicon-oxygen bond 52. In addition, the dangling silicon bond 44 has been replaced by a silicon-nitrogen-silicon bond 48. The interface shown in FIG. 4 is one which, while theoretically possible, is merely exemplary of three possible embodiments of the present invention.

For example, in combinations thereof in dielectrics in an embodiment of the present invention in which the gas having at least one atom capable of forming dielectric-atom bonds comprises deuterium, the silicon-hydrogen bond 46 or the dangling silicon bond 44 may result in formation of the silicon-deuterium bond 50. In another embodiment of the present invention the silicon-hydrogen bond 46 or the dangling silicon bond 40 may result in formation of the silicon-oxygen bond 52. In yet another embodiment of the present invention, the silicon-hydrogen bond 46 or a dangling silicon bond 44 may result in formation of the silicon-nitrogen-silicon bond 48. In still another embodiment of the present invention, the silicon-hydrogen bond 46 or a dangling silicon bond 44 may result in formation of the silicon-oxygen-silicon bond. As will be understood, use of a mixture of various gases may result in formation of more than one of the bonds 48, 50 or 52, such as shown in FIG. 4.

Because atoms of which the dielectric material is comprised may vary, the term, "dielectric-hydrogen bond" is used herein to refer to hydrogen contamination where a bond exists between a hydrogen atom and one of the normally present atoms of the dielectric material. Thus, for example, in silicon nitride contaminated with hydrogen, the H atoms may be bonded to either Si or N or both. The term "dielectric hydrogen bond" encompasses both Si—H and H—H bonds in silicon nitride. These dielectric-hydrogen bonds between atoms normally found in the dielectric and hydrogen atoms which are not a normal or desirable element of the dielectric. Thus, dielectric-hydrogen bonds as used herein can include, but are not limited to silicon-hydrogen bonds, nitrogen-hydrogen bonds, oxygen-hydrogen bonds, metal-hydrogen bonds, and combinations thereof. Therefore, in accordance with the present invention, at least a portion of the dielectric-hydrogen bonds, such as the Si—H bonds 46 of FIG. 3, are broken and replaced with dielectric-atom bonds, such as the silicon-deuterium bonds 50 or the silicon-nitrogen bonds 48, the dielectric-atom bonds being stronger than the dielectric-hydrogen bonds and less likely to form a charge storage site or other deleterious site. The atoms of the dielectric-atom bonds can include deuterium, fluorine, oxygen, silicon, nitrogen, and combinations thereof As used herein, the term "dielectric-atom bond" refers to a bond between an atom of the dielectric material and another atom where the another atom is other than hydrogen.

In accordance with the invention, the interface 36 and/or 38, which includes at least one dielectric-hydrogen bond or a plurality of dielectric-hydrogen bonds, is exposed to ultraviolet radiation and an atmosphere comprising at least one gas having at least one atom capable of forming dielectric-atom bonds under conditions sufficient to convert at least a portion of the at least one of the dielectric-hydrogen bonds to dielectric-atom bonds., e.g., dielectric-deuterium bonds, dielectric-fluorine bonds, dielectric-oxygen bonds, dielectric-nitrogen bonds, and/or dielectric-silicon bonds. In one embodiment, the gas has one or more of deuterium, oxygen, silicon, a source of reactive oxygen, and a source of reactive nitrogen. The source of reactive oxygen may be, for example, ozone, or singlet oxygen. The source of reactive nitrogen may be, for example, NO or $N_2O$ or $N_2$ with remote plasma. In one embodiment, the atmosphere comprises from about 5% by volume to about 100% by volume of the at least one gas having at least one atom capable of forming dielectric-atom bonds and from about 95% by weight to about 0% by weight of the at least one inert gas. In one embodiment, the atmosphere comprises from about 10% by volume to about 90% by volume of the at least one gas having at least one atom capable of forming dielectric-atom bonds and from about 90% by weight to about 10% by weight of the at least one inert gas. In one embodiment, the atmosphere comprises from about 20% by volume to about 80% by volume of the at least one gas having at least one atom capable of forming dielectric-atom bonds and from about 80% by weight to about 20% by weight of the at least one inert gas. In one embodiment, the atmosphere comprises from about 40% by volume to about 60% by volume of the at least one gas having at least one atom capable of forming dielectric-atom bonds and from about 60% by weight to about 40% by weight of the at least In one embodiment, the reaction conditions to which the interface 36 or 38 is exposed comprise a temperature in the range from about 300° C. to about 1200° C., and in one embodiment, about 400° C. to about 1000° C., and an one embodiment, from about 600° C. to about 900° C. In one embodiment, the ultraviolet radiation is applied at an energy and dose sufficient to break at least a portion of at least one of silicon-hydrogen bonds and nitrogen-hydrogen bonds. In one embodiment, the ultraviolet radiation is applied at an energy of from about 3.3 eV to about 8.1 eV, and in one embodiment, from about 3 eV to about 6 eV, and in one embodiment, about 3.3 eV to about 5 eV.

Here, and throughout the specification and claims, the numerical limits of the disclosed ranges and ratios and ratios may be combined. Thus, for example, in the foregoing temperature ranges, although a range 300° C. to about 900° C. is not specifically set forth, it is included within the scope of the disclosure.

Figure 9:
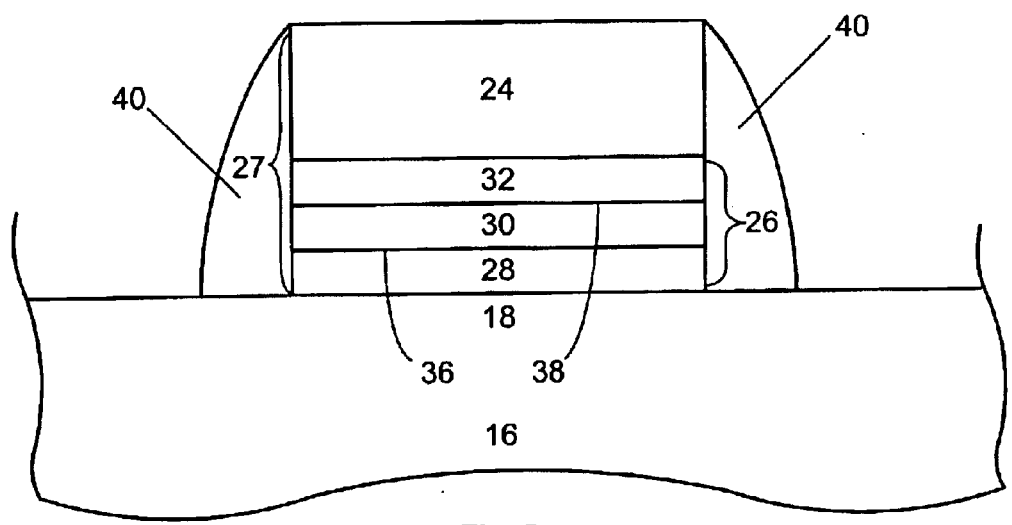
FIGS. 9–10 illustrate, in cross-section, process steps for the fabrication of spacers and an etch stop layer in accordance with the present invention.
Figure 10:
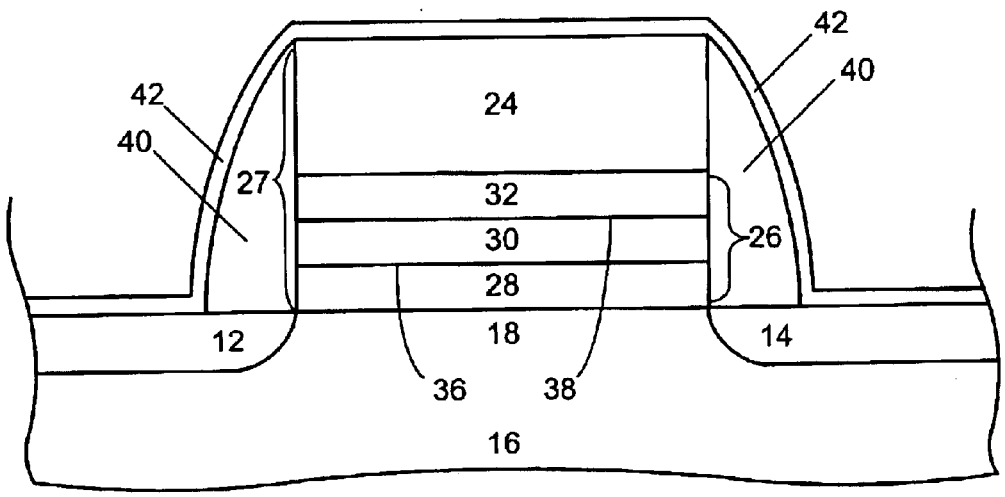
Figure 11:
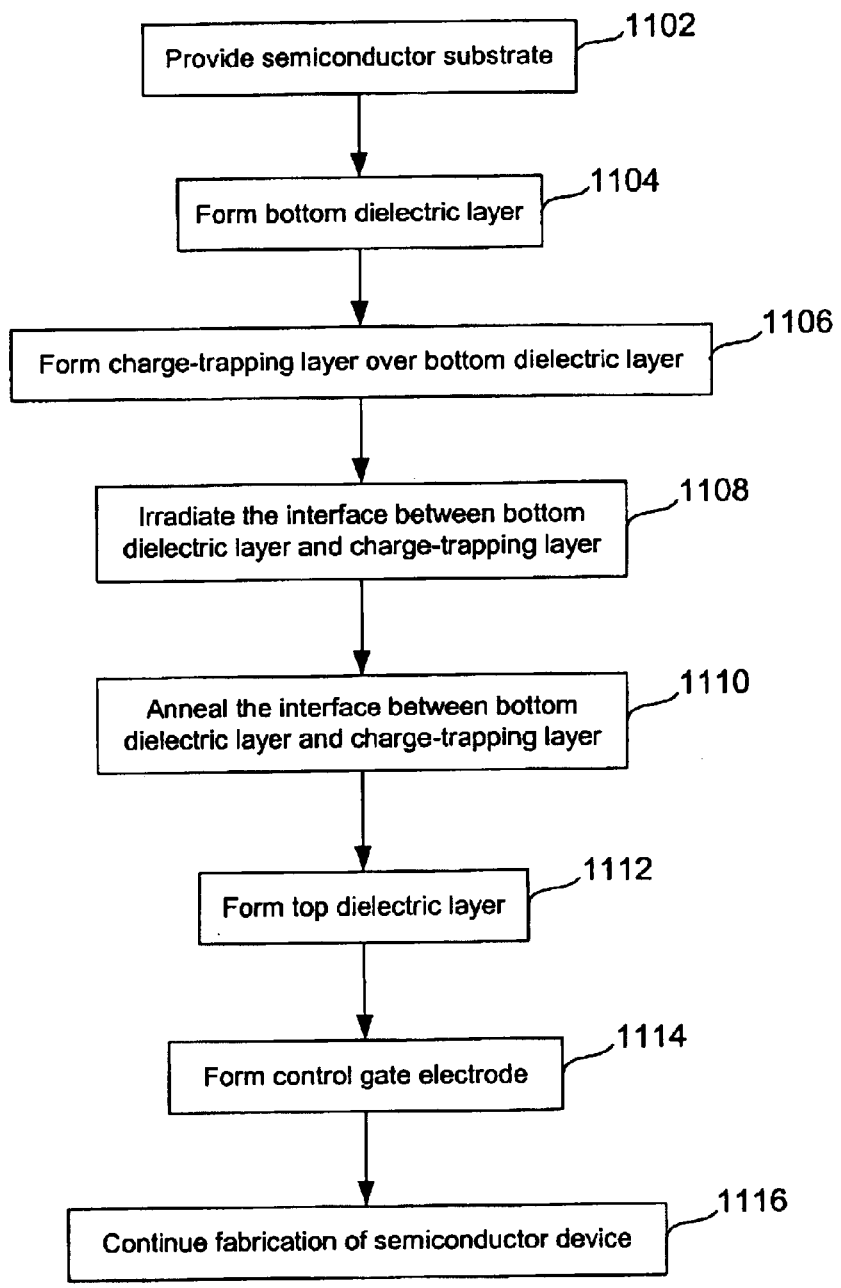
FIGS. 11–12 is a schematic flow diagram generally illustrating steps of the present invention including those associated with the removal of hydrogen from aspects of the memory cell.
Figure 12:
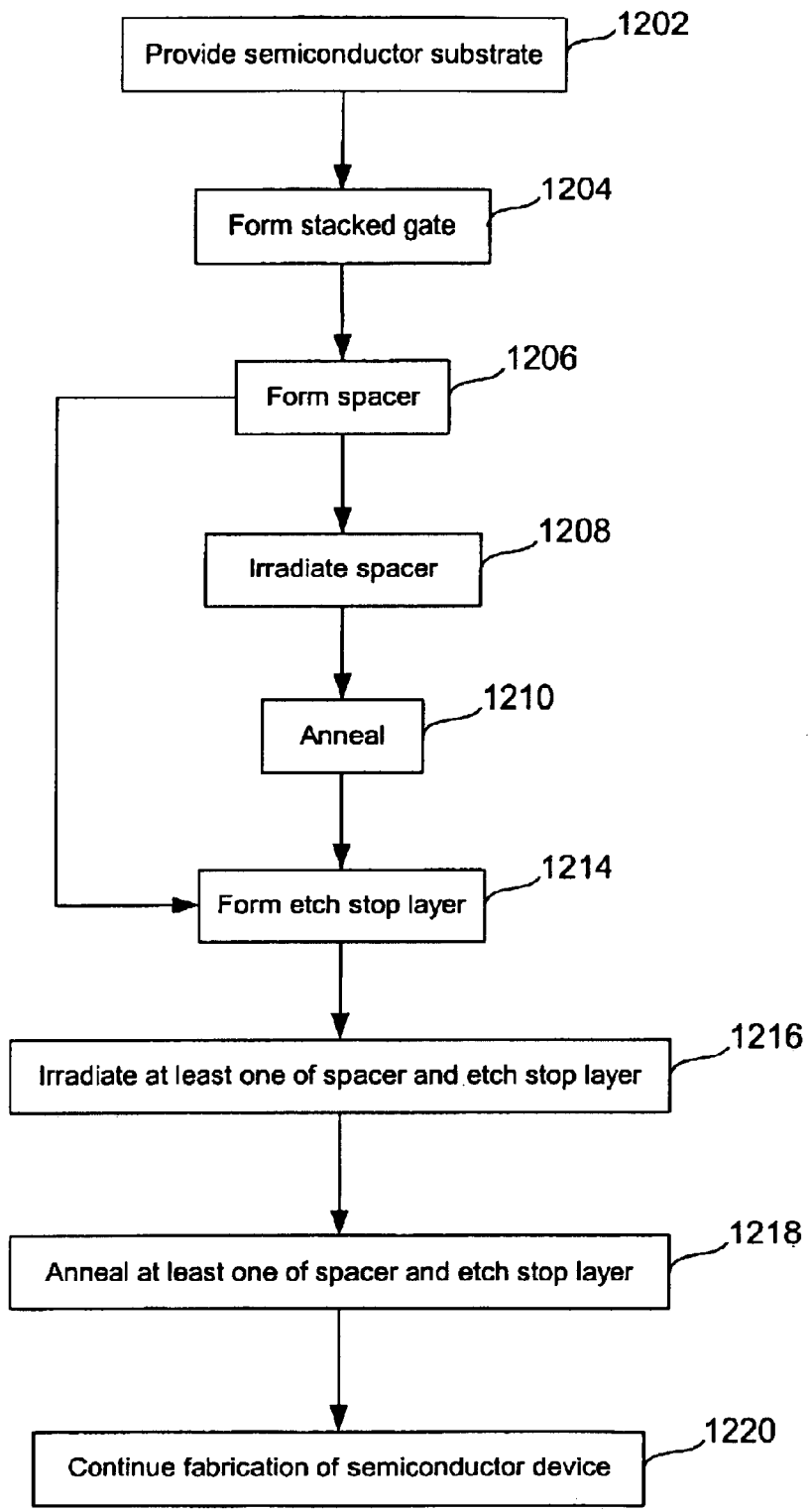

The following description of the present invention follows with reference to FIGS. 5–11. FIGS. 5–9 illustrate, in cross-section, process steps for the fabrication of an ONO and a gate structure thereover, in accordance with the invention. FIGS. 9 and 10 illustrate, in cross-section, process steps for the fabrication of spacers and an ESL. FIGS. 11 and 12 are schematic flow diagrams generally illustrating steps of processes in accordance with the present invention.

At an appropriate point in the process, the source 12 and drain 14 can be formed, by appropriate methods, such as a self-aligned implantation using the gate stack 27 as a mask. It will be understood by those skilled in the art that, while the source 12 and drain 14 are not shown in FIGS. 5–9, these elements of the device may be formed at any appropriate point in the overall process of fabrication of the semiconductor device. It also will be understood that the conventional methods of formation can impart significant hydrogen content into the spacers 40.

In the first step of the present invention, shown schematically in FIG. 11 as step 1102 and in FIG. 12 as step 1202, a semiconductor substrate is provided. The semiconductor substrate can be any appropriately selected semiconductor substrate known in the art. For example, the semiconductor substrate can be a bulk silicon substrate, a silicon-on-insulator semiconductor substrate, or a p-doped silicon substrate. Suitable semiconductor substrates include, for example, bulk silicon semiconductor substrates, silicon-on-insulator (SOI) semiconductor substrates, germanium-on-insulator (GOI), silicon-on-sapphire (SOS) semiconductor substrates, and semiconductor substrates formed of other materials known in the art. The present invention is not limited to any particular type of semiconductor substrate.

In one embodiment, the bottom dielectric layer 28 is silicon dioxide. However, it will be appreciated by those skilled in the art that the bottom dielectric layer 28 is not limited to silicon dioxide. In one embodiment, the bottom dielectric layer 28 comprises a high-K dielectric material or a composite dielectric material. As used herein, the term "high-K dielectric material" refers to a dielectric material having a K of about 10 or more. Such high-K dielectric materials include, for example, $HfO_2$, $ZrO_2$ and others, some of which are identified more fully below. In general, the term "high-K dielectric material" encompasses; binary, ternary and higher oxides and any ferroelectric material having a K of about 10 or more. In addition, the high-K dielectric materials include, for example, composite dielectric materials such as hafnium silicate, which has a K of about 14, and hafnium silicon oxynitride, which has a K of about 16, depending on the relative content of oxygen and nitrogen, and hafnium silicon nitride, which has a K of about 18.

Suitable high-K dielectric materials include $ZrO_2$, $HfO_2$, $Al_2O_3$, $Y_2O_3$, $La_2O_3$, silicates of one or more of $ZrO_2$, $HfO_2$, $Al_2O_3$, $Y_2O_3$, $La_2O_3$ or aluminates of one or more of $ZrO_2$, $HfO_2$, $Y_2O_3$, $La_2O_3$. Suitable high-K dielectric materials also include tantalum oxide ($Ta_2O_5$), barium titanate ($BaTiO_3$), titanium dioxide ($TiO_2$), cerium oxide ($CeO_2$), lanthanum oxide ($La_2O_3$), lanthanum aluminum oxide ($LaAlO_3$), lead titanate ($PbTiO_3$), strontium titanate ($SrTiO_3$), lead zirconate ($PbZrO_3$), tungsten oxide ($WO_3$), yttrium oxide ($Y_2O_3$), bismuth silicon oxide ($Bi_4Si_2O_{12}$), barium strontium titanate (BST) ($Ba_{1-x}Sr_xTiO_3$), PMN ($PbMg_xNb_{1-x}O_3$), PZT ($PbZr_xTi_{1-x}O_3$), PZN ($PbZn_xNb_{1-x}O_3$), and PST ($PbSc_xTa_{1-x}O_3$). In addition to the foregoing high-K dielectrics, other high-K dielectric materials, for example, ferroelectric high-K dielectric materials such as lead lanthanum titanate, strontium bismuth tantalate, bismuth titanate and barium zirconium titanate can be used in the present invention. Other high-K dielectric materials known in the art, including, for example binary and ternary oxides having K values of about 10 or higher, also may be used in the present invention.

As used herein, the term "composite dielectric material" refers to a dielectric material comprising the elements of at least two other dielectric materials. A composite dielectric material generally has a K value greater than 10, as defined above for a high-K dielectric material. A composite dielectric material may be, for example, a mixed-metal oxide, a metal silicate, a metal aluminate or a metal mixed-aluminate/silicate Thus, for example, using lo hafnium as the exemplary metal, the composite dielectric material may be hafnium-zirconium oxide ($Hf_xZr_{1-x}O_2$, where x ranges between 0 and 1), hafnium silicate ($HfSiO_4$), hafnium aluminate ($HfAl_2O_5$) or a hafnium mixed-aluminate/silicate, $HfO_2/SiO_2/Al_2O_3$, which may have a formula such as $Hf_2Si_2Al_2O_{11}$. A composite dielectric material may be formed by co-deposition of its component elements, or by sequential deposition followed by a treatment step, e.g., thermal treatment, to combine the elements to form the composite dielectric material. Suitable metals for the mixed-metal oxide, metal silicate, metal aluminate or metal mixed-aluminate/silicate include, for example, hafnium, zirconium, yttrium, cerium, tantalum, titanium, lanthanum, tungsten, bismuth, barium, strontium, scandium, niobium or lead, or mixtures thereof. Other metal oxides which, when combined with another metal oxide, silicon dioxide or aluminum oxide, or a mixture thereof, yield a material having a K value greater than that of silicon dioxide may be suitable. For example, the mixed-metal oxide, metal silicate, metal aluminate or metal mixed-aluminate/silicate is suitably one which substantially does not react with silicon (or polysilicon or polysilicon-germanium) at temperatures of about 600–800° C.

As used herein, the term "polysilicon-germanium" refers to a mixture of polysilicon and germanium, in which the germanium content varies from slightly more than zero up to about 60% by weight by the mixture. Thus, the amount of germanium may range from a doping amount up to about 60% by weight, of the mixture. The polysilicon-germanium may be formed by any method known in the art, i.e., by doping polysilicon with germanium, or by co-deposition, for example.

Figure 5:
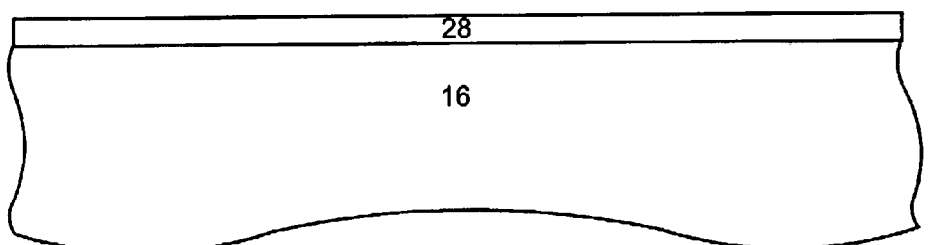
FIGS. 5–8 illustrate, in cross-section, process steps for the fabrication of an ONO material and gate structure thereover in accordance with the invention.

Turning now to FIG. 5, the formation of the bottom dielectric layer 28 is illustrated. This step is shown schematically in FIG. 11 as step 1104 and in FIG. 12 as step 1204. In accordance with the present invention, a bottom dielectric layer 28 is formed over a surface of the semiconductor substrate 16, creating the interface 36. The surface can be the upper surface of a single crystal silicon substrate. In addition, the surface may be preprocessed to remove contaminants and native oxide. A suitable preclean procedure includes cleaning the surface with a dilute solution of hydrofluoric acid or any standard cleaning procedure used in the semiconductor industry.

In one embodiment, the bottom dielectric layer 28 is formed by an HTO deposition, such as the RTCVD or LPCVD methods described above. In another embodiment, the bottom dielectric layer 28 is deposited by another suitable method, such as PECVD, ALD (ALCVD), PLD, MLD or MOCVD. Alternatively any appropriate CVD method known in the art may be used.

Formation and Treatment of Interface 36

Figure 6:
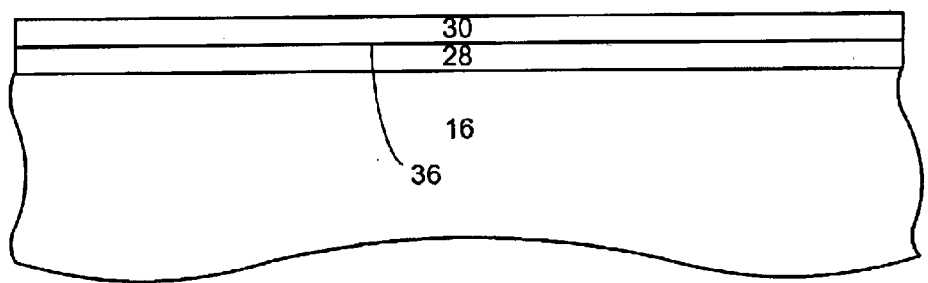

Following formation of the bottom dielectric layer 28, a charge storage layer 30 is formed over the bottom dielectric layer 28, shown schematically in FIG. 6 and referenced in FIG. 11 as step 1106 and in FIG. 12 as step 1204. It should be noted that in step 1204, a stacked-gate 27 is formed, which can comprise a bottom dielectric layer 28, a charge storage layer 30, a top dielectric layer 32, and a gate electrode layer 24. Therefore, step 1204 in FIG. 12 is a combination of steps 1104, 1106, and 1112, and 1114.

In one embodiment, the dielectric charge storage layer 30 comprises silicon nitride. In another embodiment, the charge storage layer 30 comprises a high-K dielectric material. In another embodiment, the charge storage layer 30 comprises both a high-K dielectric material and a standard-K dielectric material, such as silicon nitride. In one embodiment, the charge storage layer 30 comprises a composite dielectric material, which comprises a composite or a reaction product of two or more dielectric materials, one of which is a high-K dielectric material and the other of which may be a standard-K dielectric material such as silicon nitride. Thus, in one embodiment, the high-K dielectric material completely replaces silicon nitride in the charge storage layer 30. In another embodiment, the high-K dielectric material is, in essence, added to or combined with, silicon nitride to form a charge storage layer 30. In another embodiment, the charge storage layer 30 includes a composite dielectric material which replaces silicon nitride. In one embodiment, the high-K dielectric material includes any of the high-K dielectric materials disclosed above with respect to the bottom dielectric layer 28.

In another embodiment, the charge storage layer 30 is aluminum oxide, $Al_2O_3$. The aluminum oxide may be deposited by any suitable method, for example by LPCVD. Suitable precursors for CVD include organo-aluminum compounds such as aluminum isopropoxide and aluminum betadiketonate. The charge storage layer 30 may be deposited by other suitable methods known in the art. In one embodiment, the charge storage layer 30 may be deposited by any of the methods disclosed above for the bottom dielectric layer 28. The high-K dielectric material may be formed by reacting a suitable metal-containing gas, e.g., hafnium tetra-t-butoxide with a suitable oxygen-containing gas, e.g., oxygen ($O_2$) or nitrous oxide ($N_2O$).

In one embodiment, the storage material may be deposited by chemical vapor deposition (CVD) methods. The CVD method may be any appropriate CVD method-known in the art for deposition of a high-K material. For example, the CVD method may be ALD (ALCVD), PECVD, MOCVD or MLD, in addition to the above-mentioned RTCVD. In one embodiment, PECVD is used to deposit the charge storage layer 30. The charge storage layer may also be deposited by other suitable methods. It will be understood that the conventional methods detailed above impart significant hydrogen content into the charge storage layer 30 and interface 36 in the form of dielectric-hydrogen bonds. The hydrogen content may range from greater than 3 atomic percent up to as much as 30 atomic percent, and in some cases may be greater than 8 atomic percent, and in other cases may range, from about 10 atomic percent to as much as 30 atomic percent For example, in conventional depositions of silicon nitride charge storage layers 30, a significant proportion of the hydrogen present at the interface 36 is present in the form of Si—H bonds, and the hydrogen content may be as high as 30 atomic percent. In one embodiment, in the next step of the present invention, shown schematically in FIG. 11 as step 1108, the process comprises irradiating the interface 36 with ultraviolet radiation. In one embodiment, the ultraviolet radiation is applied at an energy in the range of about 3 eV to about 8 eV. In one embodiment, the UV is applied at an energy of at least 3.3 eV. In one embodiment, the UV radiation is applied at an energy of at least 3.9 eV. In one embodiment, the UV radiation is applied at a dose and energy sufficient to break at least one of dielectric-hydrogen bonds, e.g., silicon-hydrogen and/or nitrogen-hydrogen bonds. In one embodiment, the UV radiation comprises a wavelength ranging from about 160 nm to about 400 nm.

Further, in accordance with the present invention, shown schematically in FIG. 11 as step 1110, the interface 36 is annealed in an atmosphere comprising at least one gas having at least one atom capable of forming dielectric-atom bonds, whereby at least a portion of the dielectric-hydrogen bonds are replaced with dielectric-atom bonds. For example, the interface 36 is annealed in an atmosphere comprising at least one gas having at least one atom capable of forming dielectric-atom bonds, such as $D_2$, oxygen ($O_2$) or a source of reactive oxygen, such as ozone ($O_3$), or singlet oxygen, (O*), or a source of reactive nitrogen, such as NO or $N_2O$, or $N_2$ with remote plasma under annealing conditions to remove dielectric-hydrogen bonds from the interface 36 and replace the dielectric-hydrogen bonds with dielectric-atom bonds that are stronger than the dielectric-hydrogen bonds. In one embodiment, the atmosphere further comprises at least one inert gas, such as a noble gas (He, Ne, Ar, Kr or Rn) or nitrogen ($N_2$).

In one embodiment, the interface 36 is annealed in an atmosphere comprising $D_2$. In one embodiment, the annealing conditions are similar to a rapid thermal anneal, except for the presence of the ultraviolet radiation and the gas having at least one atom capable of forming dielectric-atom bonds. In one embodiment, the interface 36 is annealed at a temperature in the range from about 300° C. to about 1200° C., in one embodiment from about 500° C. to about 1000° C. and in another embodiment from about 700° C. to about 800° C. The temperature range may be limited by impurity diffusion in silicon; as will be appreciated by those skilled in the art.

In one embodiment, a RTA is performed for a period ranging from about 5 seconds to about 5 minutes, and in one embodiment, for a period ranging from about 15 seconds to about 60 seconds. In one embodiment, the anneal is performed in a furnace for a period ranging from about 1 minute to about 3 hours, and in one embodiment, for a period ranging from about 30 minutes to about 1 hour.

In one embodiment, the atmosphere is substantially 100% $D_2$. In one embodiment, the atmosphere comprises $D_2$ and at least one inert gas. In such embodiment, the ratio of at least one inert gas to $D_2$ the ranges from about 1:20 to about 20:1, and in another embodiment, the ratio ranges from about 1:10 to about 1:2, and in another, the ratio ranges from about 1:7 to about 1:5. In one embodiment, the atmosphere comprises from about 5% by volume to about 100% by volume of the deuterium gas and from about 95% by weight to about 0% by weight of the at least one inert gas. In one embodiment, the atmosphere comprises from about 5% by volume to about 95% by volume of deuterium and from about 95% by weight to about 5% by weight of the at least one inert gas.

In one embodiment, the atmosphere comprises oxygen or a source of reactive oxygen as the gas having at least one atom capable of forming dielectric-atom bonds. In one embodiment, the atmosphere comprises both oxygen or a source of reactive oxygen and at least one inert gas. In one embodiment, the atmosphere comprises from about 5% by volume to about 95% by volume of the oxygen or a source of reactive oxygen and from about 95% by weight to about 5% by weight of the at least one inert gas. As disclosed above, the source of reactive oxygen may include one or more of oxygen, ozone, nitric oxide, nitrous oxide, singlet oxygen. In one embodiment, the atmosphere comprises a source of reactive nitrogen.

In one embodiment, the pressure ranges from about 1 torr to about 2000 torr. In one embodiment, the pressure is about 760 torr. In one embodiment, the pressure ranges from about 1 torr to about 300 torr. In one embodiment, the pressure is greater than about 760 torr.

In one embodiment, the steps of irradiating and annealing are performed concurrently. In one embodiment, the steps of irradiating and annealing are performed consecutively, and in one embodiment, substantially simultaneously. In one embodiment, the steps of irradiating and annealing are carried out in a single chamber or apparatus with no movement of the substrate between steps. In one embodiment, the steps of irradiating and annealing are repeated at least once. Although not to be bound by theory, the ultraviolet radiation in conjunction with the elevated temperatures may be considered to primarily help break hydrogen bonds, while the gas having at least one atom capable of forming dielectric-atom bonds used in the annealing process may be considered to primarily passivate dangling bonds, both those formed in the process and those preexisting at the interface 36.

Formation and Treatment of Interface 38

Figure 7:
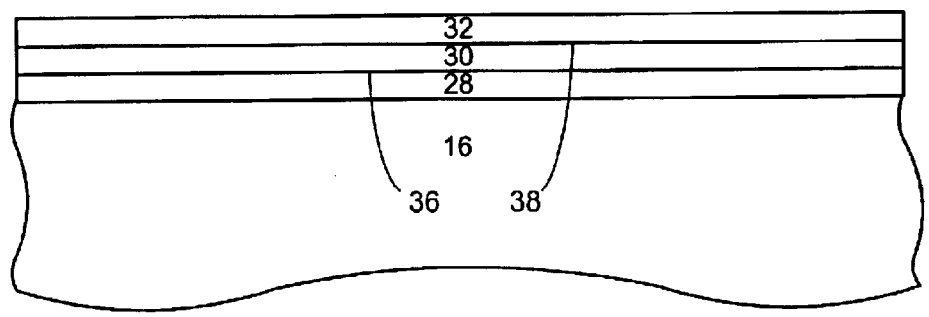
Figure 8:
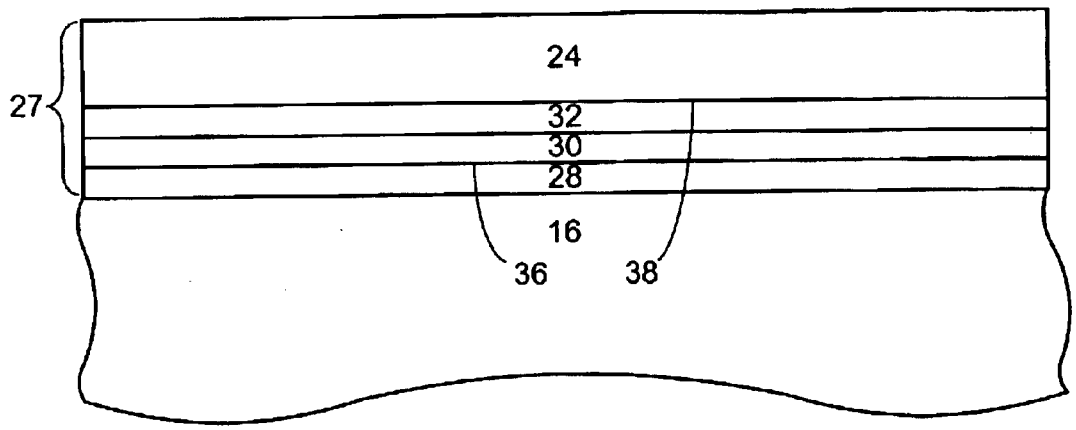

Following deposition of the charge storage layer 30, in the next step of the process of fabricating the flash memory device, shown schematically in FIG. 7 and referenced in FIG. 11 as step 1112 and in FIG. 12 as step 1204, a top dielectric layer 32 is formed over the charge storage layer 30 by a suitable technique, thereby forming interface 38. The top dielectric layer 32 may comprise any of the materials disclosed above for the bottom dielectric layer 28. For example, the top dielectric layer 32 may comprise silicon dioxide, a high-K dielectric material or a composite dielectric material, as defined herein.

In one embodiment, the top dielectric layer 32 is formed by an in-situ steam generation (ISSG) oxidation of the upper surface of the charge storage layer 30. In one embodiment, the top dielectric layer 32 is formed by an HTO deposition, such as the RTCVD or LPCVD methods described above. In one embodiment, the top dielectric layer 32 is deposited by another suitable method, such as PECVD, ALD (ALCVD), PLD, MID or MOCVD. The CVD method may be any appropriate CVD method known in the art.

The top dielectric layer 32 may be formed by any appropriate method known in the art. In one embodiment, when the charge storage layer 30 is silicon nitride, the top dielectric layer 32 is grown by oxidation of a portion of the silicon nitride layer 30. In another embodiment, the top dielectric layer 32 is deposited by an appropriate deposition method.

It will be understood that the conventional methods detailed above can impart significant hydrogen content into the top dielectric layer 32, charge storage layer 30, and/or interface 38 in the form of dielectric-hydrogen bonds.

Therefore, in one embodiment, interface 38 is irradiated and annealed according to the processes detailed above with reference to steps 1108 and 1110 and interface 36. In one embodiment, both interface 36 and interface 38 are irradiated at the same time and annealed at the same time. In one embodiment, interface 36 is irradiated and annealed prior to formation of the top dielectric layer 32 and interface 38 is irradiated and annealed subsequent to formation of the top dielectric layer 32. In one embodiment, the steps of irradiating and annealing are repeated at least once.

As shown in FIG. 9, following formation of the ONO 26 in accordance with the present invention, a layer forming a control gate electrode 24 is formed on the top dielectric layer 32, shown schematically in FIG. 11 as step 1114 and in FIG. 12 as step 1204. The stacked-gate structure 27 is completed by depositing a layer of gate-forming material over the top dielectric layer 32. The layer forming a control gate electrode 24 may comprise any material known in the art for such use. For example, the control gate electrode layer 24 may comprise polysilicon, polysilicon-germanium, a metal silicide, a metal, or any other suitable material known in the art. A lithographic patterning and etching process may then be carried out to define the stacked gate structure shown in FIG. 1, including the control gate electrode 24 and the ONO 26. Those skilled in the art will recognize that various gate-forming materials can be used to fabricate the control gate electrode 24. For example, the control gate electrode 24 can be formed with polycrystalline silicon, amorphous silicon, a refractory metal silicide, a metal, and the like.

In one embodiment, following formation of the control gate electrode 24 and the charge storage structure 26, fabrication of the semiconductor device continues, as indicated in the final step 1116 of FIG. 11.

Formation and Treatment of Spacers 40 and ESL 42

In one embodiment, following formation of the stacked gate 27, spacers 40 are formed, as indicated in step 1206 of FIG. 12, to yield a structure such as that shown in FIG. 9. The spacers 40 may comprise silicon nitride or other appropriate dielectric material. Any known material may be used for the spacers 40, and any appropriate methods for formation of the spacers 40 may be used.

The spacers 40 may be formed or deposited by conventional methods, using conventional precursor materials. In one embodiment, the spacers 40 comprise silicon nitride or aluminum oxide. In one embodiment, the spacers 40 are deposited by RTCVD or LPCVD methods, such as those described above. In one embodiment, the spacers 40 are deposited by another suitable method, such as PECVD, ALD (ALCVD), PLD, MLD or MOCVD. The CVD method may be any appropriate CVD method known in the art LPCVD has been conventionally used to deposit spacers comprising silicon nitride at temperatures in the range of about 700° C. to about 800° C. Many conventional deposition methods of spacers 40 yield a hydrogen content range from greater than 3 atomic percent up to as much as 30 atomic percent, and in some cases may be greater than 8 atomic percent, and in other cases may range from about 10 atomic percent to as much as 30 atomic percent. At least some of the hydrogen content exists in the form of dielectric-hydrogen bonds.

Illustrated as steps 1208 and 1210, the spacers 40 are be irradiated and annealed. In one embodiment, the process continues directly to the formation of the ESL 42 following formation of the spacers 40. In one embodiment, the steps of irradiating 1208 and annealing 1210 the spacers 40 are performed prior to formation of the ESL 42. It will be understood, however, that the steps of irradiating 1208 and annealing 1210 the spacers 40 may be performed at any time after formation of the spacers 40, and are not necessarily performed prior to formation of the ESL 42. Therefore, in one embodiment, the spacers 40 are irradiated and annealed according to the processes detailed above with reference to steps 1108 and 1110 and interface 36. In one embodiment, the steps of irradiating 1208 and annealing 1210 are repeated at least once.

The next step in the process of the present invention is the deposition of the ESL 42 in accordance with the invention, illustrated as step 1214, to create the structure shown in FIG. 10. The ESL may be formed or deposited by conventional methods, using conventional precursor materials. In one embodiment, the ESL 42 comprises silicon nitride or aluminum oxide. In one embodiment, the ESL 42 is deposited by RTCVD or LPCVD methods, such as those described above. In one embodiment, the ESL 42 is deposited by another suitable method, such as PECVD, ALD (ALCVD), PLD, MLD or MOCVD. The CVD method may be any appropriate CVD method known in the art. LPCVD has been conventionally used to deposit ESLs comprising silicon nitride at temperatures in the range of about 700° C. to about 800° C. Many conventional deposition methods of ESL layers yield a hydrogen content range from greater than 3 atomic percent up to as much as 30 atomic percent, and in some cases may be greater than 8 atomic percent, and in other cases may range from about 10 atomic percent to as much as 30 atomic percent. At least some of the hydrogen content exists in the form of dielectric-hydrogen bonds.

Illustrated as steps 1216 and 1218, the next steps in the process of the present invention are irradiating and annealing at least one of the spacers 40 and the ESL 42. It will be appreciated that the step irradiating of the spacers 40 may be performed any time after formation of the spacers 40, and is not necessarily performed after formation of the ESL 42. In one embodiment, only the ESL 42 is irradiated 1216 and annealed 1218. In one embodiment, of at least one of the spacers 40 and the ESL 42 is irradiated and annealed. In one embodiment, the irradiation and annealing processes are performed as detailed above with reference to steps 1108 and 1110 and interface 36. In addition, either or both the interface 36 and the interface 38 may also be irradiated and annealed at the same steps as the irradiation and annealing of either or both the spacers 40 and the ESL 42.

Following irradiation and annealing, fabrication of the semiconductor device continues, as indicated in the final step 1220 of FIG. 12.

There has been disclosed in accordance with the invention a process for fabricating a semiconductor device that fully provides the advantages set forth above. Although described in terms of, and particularly applicable to, two-bit EEPROM devices, the present invention is broadly applicable to fabrication of any semiconductor device including a charge storage structure, such as a floating gate device.

Industrial Applicability

According to the present invention, semiconductor devices that have hydrogen contamination at the interface between the semiconductor substrate and a dielectric layer, or at a spacer or etch stop layer are susceptible to performance degradation. Conventional methods for fabricating semiconductor devices impart dielectric-hydrogen bonds into the above regions and structures. These regions and structures can be irradiated and annealed under conditions sufficient to convert the dielectric-hydrogen bonds to dielectric-atom bonds, such as dielectric-deuterium bonds, dielectric-silicon bonds, dielectric-oxygen bonds, dielectric-fluorine bonds, or dielectric-nitrogen bonds. Thus, the present invention provides a process for fabricating a superior semiconductor device without departing from the conventional methods and precursor materials used to form or deposit the above-mentioned structures and regions.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the thicknesses of the individual layers making up the charge storage structure can be varied from that described herein. It is therefore intended to include within the invention all such variations and modifications that fall within the scope of the appended claims and equivalents thereof.

What is claimed is:

1. A process for removing hydrogen contamination from a semiconductor device comprising:
   forming at least one dielectric layer, wherein the dielectric layer comprises dielectric-hydrogen bonds;
   irradiating the dielectric layer with ultraviolet radiation sufficient to break at least a portion of the dielectric-hydrogen bonds; and
   annealing the dielectric layer in an atmosphere comprising at least one gas having at least one atom capable of forming dielectric-atom bonds, whereby at least a portion of dielectric-hydrogen bonds are replaced with dielectric-atom bonds,
   wherein the dielectric layer is one or more of a nitride layer, a high-K dielectric material layer and a composite dielectric material layer.

2. The process of claim 1, wherein the dielectric-hydrogen bonds comprise one or more of silicon-hydrogen bonds, nitrogen-hydrogen bonds, oxygen-hydrogen bonds, and metal-hydrogen bonds.

3. The process of claim 1, wherein the at least one atom is one or more of deuterium, fluorine, oxygen, silicon, and nitrogen.

4. The process of claim 1, wherein the dielectric layer is one or more of a charge storage layer, a spacer, and an etch stop layer.

5. The process of claim 1, wherein the dielectric layer is a nitride layer.

6. The process of claim 1, wherein the atmosphere comprises from about 5% by volume to about 95% by volume of the at least one gas having at least one atom capable of forming dielectric-atom bonds and from about 95% by weight to about 5% by weight of the at least one inert gas.

7. The process of claim 1, wherein the ultraviolet radiation is applied at an energy of from about 3 eV to about 8 eV.

8. The process of claim 1, wherein the ultraviolet radiation is applied at wavelengths from about 160 nm to about 400 nm.

9. The process of claim 1, wherein the steps of irradiating and annealing are repeated at least once.

10. The process of claim 1, wherein the steps of irradiating and annealing are performed substantially simultaneously.

11. The process of claim 1, wherein the dielectric layer is a charge storage layer of an ONO comprising a bottom dielectric layer, a charge storage layer, and a top dielectric layer.

12. The process of claim 11, wherein the charge storage layer is formed over the bottom dielectric layer, the bottom dielectric layer and the charge storage layer, forming an interface comprising dielectric-hydrogen bonds.

13. The process of claim 12, further comprising the steps of:
   forming a top dielectric layer over the charge storage layer, the top dielectric layer and the charge storage layer forming a top interface comprising dielectric-hydrogen bonds;
   irradiating the top interface with ultraviolet radiation sufficient to break at least a portion of the dielectric-hydrogen bonds; and
   annealing the top interface in an atmosphere comprising at least one gas having at least one atom capable of forming dielectric-atom bonds, whereby at least a portion of dielectric-hydrogen bonds are replaced with dielectric-atom bonds.

14. The process of claim 13, wherein the interface and the top interface are irradiated in the same step, and wherein the interface and the top interface are annealed in the same step.

15. A process for fabricating a semiconductor device comprising:
   providing a semiconductor substrate;
   forming an ONO material over the semiconductor substrate;
   forming a gate electrode layer over the ONO material;
   forming a dielectric spacer adjacent to the ONO and a dielectric etch stop layer over the gate electrode layer and protective spacer such that at least one of the dielectric spacer and dielectric etch stop layer comprises dielectric-hydrogen bonds;
   irradiating at least one of the dielectric spacer and the dielectric etch stop layer with ultraviolet radiation sufficient to break at least a portion of the dielectric-hydrogen bonds; and
   annealing at least one of the spacer and the etch stop layer in an atmosphere comprising at least one gas having at least one atom capable of forming dielectric-atom bonds, whereby at least a portion of dielectric-hydrogen bonds are replaced with dielectric-atom bonds,
   wherein at least one of the dielectric spacer and the dielectric etch stop layer is one or more of a nitride layer, a high-K dielectric material layer and a composite dielectric material layer.

16. The process of claim 15 wherein the step of annealing is carried out at a temperature ranging from about 600° C. to about 900° C.

17. A process for fabricating a semiconductor device comprising:
   providing a semiconductor substrate;
   forming an oxide layer over the semiconductor substrate;
   forming a nitride layer over the oxide layer, the oxide layer and the nitride layer forming an interface comprising silicon-hydrogen and nitrogen-hydrogen bonds;
   irradiating the interface with ultraviolet radiation sufficient to break at least a portion of at least one of the silicon-hydrogen and nitrogen-hydrogen bonds; and
   annealing the interface in an atmosphere comprising at least one gas having at least one atom capable of forming at least one of silicon-atom bonds and nitrogen-atom bonds, whereby at least a portion of at least one of the silicon-hydrogen bonds and nitrogen-hydrogen bonds are replaced with at least one of the silicon-atom bonds and nitrogen-atom bonds.

18. The process of claim 17, wherein the ultraviolet radiation is applied at an energy of from about 3.9 eV to about 8.1 eV.

19. The process of claim 18, wherein the atmosphere comprises from about 5% by volume to about 95% by volume of the at least one gas having at least one atom capable of forming dielectric-atom bonds and from about 95% by weight to about 5% by weight of the at least one inert gas, wherein the anneal conditions comprise a temperature in the range from about 300° C. to about 1200° C.

20. The process of claim 19, wherein the steps of irradiating and annealing are performed substantially simultaneously.

* * * * *

UNITED STATES PATENT AND TRADEMARK OFFICE
CERTIFICATE OF CORRECTION

PATENT NO. : 6,740,605 B1
DATED : May 25, 2004
INVENTOR(S) : Shiraiwa et al.

It is certified that error appears in the above-identified patent and that said Letters Patent is hereby corrected as shown below:

Column 4,
Line 2, replace "not," with -- not --
Line 15, replace "fabrications" with -- fabrication --
Line 32, after "cell" add -- 10 --

Column 7,
Line 61, after "at least" add -- one inert gas --

Column 8,
Line 56, replace "encompasses;" with -- encompasses --

Column 9,
Line 25, replace "using lo" with -- using --

Column 10,
Line 46, replace "betadiketonate"with -- beta-diketonate --
Line 56, replace "method-known" with -- method known --
Line 61, before "may also" add -- 30 --

Column 11,
Line 2, replace "range," with -- range --
Line 3, replace "percent" with -- percent. --
Line 31, "replace "(O*)" with -- (O·) --
Line 49, replace "silicon;" with -- silicon, --

Column 13,
Line 50, replace "art" with -- art. --

Signed and Sealed this

Ninth Day of November, 2004

JON W. DUDAS
*Director of the United States Patent and Trademark Office*